(12) United States Patent
Kim et al.

(10) Patent No.: US 10,804,501 B2
(45) Date of Patent: Oct. 13, 2020

(54) DISPLAY DEVICE INCLUDING FINGERPRINT RECOGNITION AREA

(71) Applicant: SAMSUNG DISPLAY CO., LTD., Yongin-si, Gyeonggi-Do (KR)

(72) Inventors: Yun Ho Kim, Hwaseong-si (KR); Go Woon Kang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/249,506

(22) Filed: Jan. 16, 2019

(65) Prior Publication Data

US 2019/0252645 A1    Aug. 15, 2019

(30) Foreign Application Priority Data

Feb. 12, 2018  (KR) ........................ 10-2018-0016911

(51) Int. Cl.
| | | |
|---|---|---|
| *H01L 51/52* | (2006.01) | |
| *G06K 9/00* | (2006.01) | |
| *H01L 27/32* | (2006.01) | |
| *H01L 27/30* | (2006.01) | |

(52) U.S. Cl.
CPC ........ *H01L 51/5284* (2013.01); *G06K 9/0004* (2013.01); *G06K 9/00053* (2013.01); *H01L 27/307* (2013.01); *H01L 27/3227* (2013.01); *H01L 51/5253* (2013.01)

(58) Field of Classification Search
CPC ............... H01L 51/5284; H01L 27/307; H01L 51/5253; H01L 27/3227; H01L 27/3218; H01L 27/3244; H01L 27/323; G06K 9/0004; G06K 9/00053
See application file for complete search history.

(56) References Cited

U.S. PATENT DOCUMENTS

| | | | | |
|---|---|---|---|---|
| 2012/0092350 A1* | 4/2012 | Ganapathi | .......... | G02B 26/0833 345/501 |
| 2014/0354596 A1* | 12/2014 | Djordjev | .............. | G06K 9/0002 345/175 |
| 2014/0359757 A1* | 12/2014 | Sezan | ..................... | G06F 21/32 726/19 |
| 2016/0099294 A1* | 4/2016 | Jeong | .................. | H01L 27/3276 257/40 |
| 2017/0270342 A1* | 9/2017 | He | .......................... | G06F 3/042 |
| 2017/0372113 A1* | 12/2017 | Zhang | .................. | G02B 5/3025 |

(Continued)

FOREIGN PATENT DOCUMENTS

| | | |
|---|---|---|
| KR | 20160048643 | 5/2016 |
| KR | 20160083609 | 7/2016 |

(Continued)

*Primary Examiner* — Premal R Patel
(74) *Attorney, Agent, or Firm* — F. Chau & Associates, LLC

(57) ABSTRACT

A display device includes a light shielding layer having an opening. A fingerprint sensor is disposed within or overlapping the opening of the light shielding layer. A light path control layer is disposed on the fingerprint sensor and the light shielding layer. The light path control layer covers the opening of the light shielding layer. A display panel is disposed on the light path control layer and includes a plurality of display elements. A window panel is disposed on the display panel.

16 Claims, 13 Drawing Sheets

(56) References Cited

U.S. PATENT DOCUMENTS

| | | | | |
|---|---|---|---|---|
| 2018/0025205 A1* | 1/2018 | Wu | .................... | G06K 9/00046 |
| | | | | 382/127 |
| 2018/0151759 A1* | 5/2018 | Huang | .............. | H01L 31/02002 |
| 2018/0314096 A1* | 11/2018 | Yang | .................... | G06K 9/0004 |
| 2018/0373913 A1* | 12/2018 | Panchawagh | ........ | G06K 9/0002 |
| 2019/0087630 A1* | 3/2019 | Seo | ...................... | G06K 9/0012 |
| 2019/0205596 A1* | 7/2019 | Kim | .................... | G06K 9/0002 |
| 2019/0205603 A1* | 7/2019 | Lee | .................... | H01L 27/3272 |

FOREIGN PATENT DOCUMENTS

| | | |
|---|---|---|
| KR | 20160117865 | 10/2016 |
| KR | 20170103159 | 9/2017 |
| KR | 20170107756 | 9/2017 |

\* cited by examiner

DISPLAY DEVICE INCLUDING FINGERPRINT RECOGNITION AREA

CROSS-REFERENCE TO RELATED APPLICATION

This application claims priority from and the benefit of Korean Patent Application No. 10-2018-0016911, filed on Feb. 12, 2018, which is herein incorporated by reference.

TECHNICAL FIELD

The present disclosure relates to a display device, and more specifically, to a display device including a fingerprint recognition area.

DISCUSSION OF THE RELATED ART

Various types of display devices, such as liquid crystal displays and organic light emitting displays are being used for a wide variety of purposes.

Of these display devices, organic light emitting displays display an image using an organic light emitting diode that generates light through recombination of electrons and holes. Such organic light emitting displays have a relatively fast response speed, high luminance, wide viewing angle, and low power consumption.

SUMMARY

A display device includes a light shielding layer having an opening. A fingerprint sensor is disposed within or overlapping the opening of the light shielding layer. A light path control layer is disposed on the fingerprint sensor and the light shielding layer. The light path control layer covers the opening of the light shielding layer. A display panel is disposed on the light path control layer and includes a plurality of display elements. A window panel is disposed on the display panel.

A display device includes a display panel. A window panel is disposed on the display panel. The display panel includes a fingerprint recognition area. A light shielding layer is disposed under the display panel. The light shielding layer includes an opening overlapping the fingerprint recognition area. A light path control layer is disposed between the light shielding layer and the display panel and overlaps the opening of the light shielding layer.

A display device includes a light shielding layer disposed on a light path control layer. The light shielding layer has an opening disposed therein. A fingerprint sensor is disposed on the light path control layer, within the opening of the light shielding layer. A display panel is disposed over the light path control layer. The light path control layer includes a plurality of viewing angle control patterns and a plurality of light transmitting regions disposed between each of the plurality of viewing angle control patterns.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
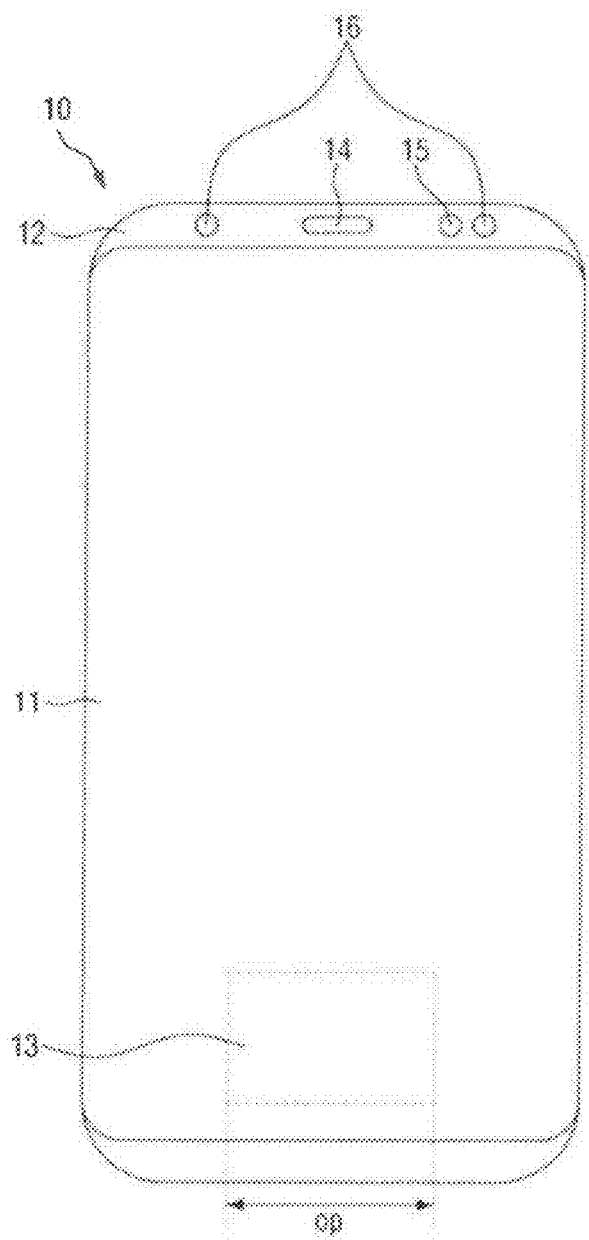
FIG. 1 is a schematic plan view of a display device according to an exemplary embodiment of the present disclosure.

In describing exemplary embodiment of the present disclosure illustrated in the drawings, specific terminology is employed for sake of clarity. However, the present disclosure is not intended to be limited to the specific terminology so selected, and it is to be understood that each specific element includes ail technical equivalents which operate in a similar manner.

In the accompanying figures, the size and relative sizes of layers, films, panels, regions, etc., may be exaggerated for clarity and descriptive purposes. Also, like reference numerals may denote like elements throughout the specification and figures.

When an element or layer is referred to as being "on," "connected to," or "coupled to" another element or layer, it may be directly on, connected to, or coupled to the oilier element or layer or intervening elements or layers may be present. Although the terms first, second, etc. may be used herein to describe various elements components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Hereinafter, exemplary embodiments of the present invention will be described with reference to the drawings.

FIG. 1 is a schematic plan view of a display device 10 according to an exemplary embodiment of the present invention.

Referring to FIG. 1, the display device 10, according to exemplary embodiments of the present invention, may be divided into a display area 11 and a non-display area 12.

The display area 11 is defined as an area that displays an image. In addition, the display area 11 can be used to include various detection sensors for detecting ambient conditions. According to an exemplary embodiment of the present disclosure, at least a portion of the display area 11 may be a fingerprint recognition area 13 configured for recognizing a user's fingerprint. For example, the fingerprint recognition area 13 may be used both to display an image and may be used as an area for recognizing (e.g. identifying) a user's fingerprint. In a window panel 400, which will be described below with reference to FIG. 2, the fingerprint recognition area 13 is defined as in area overlapping an opening "op" of a light shielding layer 600. As used herein, the term "overlap" is understood to mean that two elements are overlapping in a vertical direction, as illustrated, that is perpendicular to the primary direction of extension of the various layers and panels.

A fingerprint sensor 700, which is described below with reference to FIG. 2, may be disposed within the fingerprint recognition area 13. In addition, a width "op" of the fingerprint recognition area 13 may be equal to a width of the opening "op" of the light shielding layer 600 (see FIG. 2), which is described below with reference to FIG. 2. Both the width of the fingerprint recognition area 13 and the width of the opening "op" of the light shielding layer 600 will be indicated by reference character "op" and are described below with reference to FIG. 2. The size and shape of the fingerprint recognition area 13 are not limited to those illustrated in FIG. 1, which appears as a rectangle, and other shapes, such as a circle or an arbitrary shape, may be used.

The non-display area 12 is disposed outside of the display area 11 and the non-display area 12 is defined as an area that does not display an image. A speaker module 14, a camera module 15, and a sensor module 16 may be disposed in the non-display area 12. According to an exemplary embodiment of the present invention, the sensor module 16 may include a luminance sensor, a proximity sensor, an infrared sensor, and/or an ultrasonic sensor. According to an exemplary embodiment of the present disclosure, the sensor module 16 may be configured to recognize (e.g. identify) the iris of a user. The arrangement of the speaker module 14, the camera module 15, and the sensor module 16 is not limited to that illustrated in FIG. 1 and other arrangements may be used.

The display area 11 may be substantially flat according to some exemplary embodiments of the present disclosure. Alternatively, at least a portion of the display area 11 may be bent or curved. The display area 11 can also be disposed in an edge area of the display device 10 so as to span from edge-to-edge on the display device 10 and may even partially wrap around the display device 10 at its edges.

Figure 2:
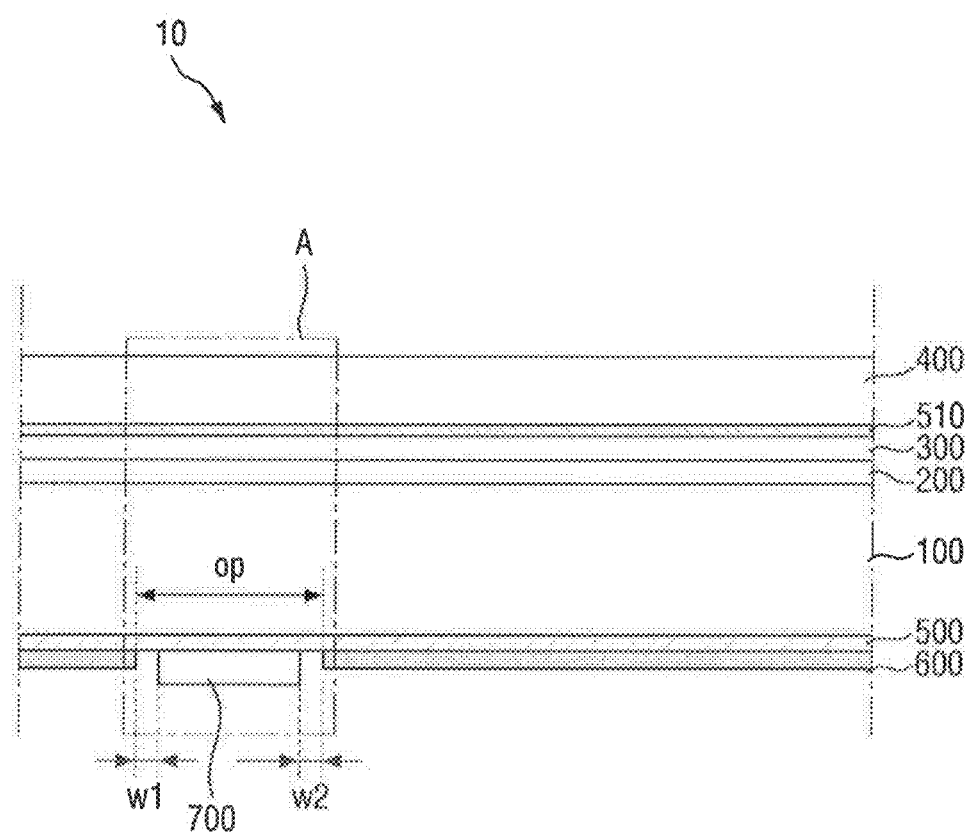
FIG. 2 is a schematic cross-sectional view of the display device illustrated in FIG. 1 according to an exemplary embodiment of the present disclosure.

FIG. 2 is a schematic cross-sectional view of the display device 10 illustrated in FIG. 1.

Referring to FIG. 2, the display device 10 may include a display panel 100, an input sensing layer 200, an anti-reflection layer 300, and the window panel 400. As used herein, a "panel" may be a pre-fabricated element that is bonded to another element by an adhesive. As used herein, a "layer" may be an element that is formed in-place upon another element through a continuous process. The panel includes a base layer that acts as a base surface. The layer might not have the base layer. For example, when an element is described as a "layer," the element may be disposed on the base surface provided by another element. Here, the base layer may include a synthetic resin film, a composite film, a glass substrate, and the like.

The display panel 100 is a panel that is configured to display an image. The display panel 100 includes a plurality of display elements. According to an exemplary embodiment of the present invention, the display elements may be organic light emitting diodes. For example, the display panel 100 may be an organic light emitting display panel. The display panel 100 will hereinafter be described as an organic light emitting display panel but it is to be understood that other forms of display panels may be used.

The input sensing layer 200 may be configured to sense a user's finger or stylus that makes contact with the display device 10. The input sensing layer 200 may be disposed on the display panel 100. The input sensing layer 200 may be formed on the display panel 100 through a continuous process.

The anti-reflection panel 300 may be configured to reduce the reflectance of external light incident from above the window panel 400. The anti-reflection panel 300 may include a retarder and a polarizer in an exemplary embodiment of the present invention. In addition, the anti-reflection panel 300 may include a color filter and a black matrix. Alternatively, the anti-reflection panel 300 may be omitted.

The window panel 400 may protect the display panel 100 and/or the input sensing layer 200 from scratching, breaking, or otherwise being damaged. The window panel 400 may be disposed on the anti-reflection layer 300. For example, the window panel 400 may be bonded to the anti-reflection layer 300 by an adhesive 510. According to an exemplary embodiment of the present invention, the adhesive 510 may be a pressure sensitive adhesive (PSA), an optically clear adhesive (OCA), or an optically clear resin (OCR) film.

The input sensing layer 200 may be an input sensing panel. In addition, the anti-reflection layer 300 may be an anti-reflection panel. In this case, the input sensing panel and the anti-reflection panel may be bonded to the display panel 100 and the input sensing panel by separate adhesives.

A light path control layer 500 may selectively block the path of light incident from the outside to the display panel 100. The light path control layer 500 may be disposed under the display panel 100. In an exemplary embodiment of the present invention, the light path control layer 500 may be formed as an adhesive film and may be attached directly to the display panel 100. In an exemplary embodiment of the present invention, the light path control layer 500 may be attached to the display panel 100 by an adhesive. The light path control layer 500 will be described in more detail below with reference to FIG. 3.

The light shielding layer 600 may block light provided from under the display panel 100 from reaching the display panel 100. The light shielding layer 600 may be disposed under the light path control layer 500. In an exemplary embodiment of the present invention, the light shielding layer 600 may be formed as an adhesive film and may be attached directly to the light path control layer 500. In an exemplary embodiment of the present invention, the light path control layer 500 may be attached to the light path control layer 500 by an adhesive. The material of the light shielding layer 600 may be formed of any substance that is suitable to block light provided from under the display panel 100 from reaching the display panel 100. In an exemplary embodiment of the present invention, the light shielding layer 600 may include a dark pigment such as a black pigment, a black dye, a gray pigment or a gray dye or may be made of a light shielding material such m a photoresist.

The light shielding layer 600 may include the opening "op". The opening "op" of the light shielding layer 600 is defined as an area where the light shielding layer 600 is not formed. As described above, the width of the opening "op" of the light shielding layer 600 may be substantially equal to the width "op" of the fingerprint recognition area 13 (see FIG. 1). The fingerprint sensor 700, which is described in detail below, is disposed to overlap the opening "op" of the light shielding layer 600 in a direction perpendicular to the display panel 100.

The fingerprint sensor 700 may be configured to recognize (e.g. identify/authenticate) a user's fingerprint. A user fingerprint recognition method of the fingerprint sensor 700 will be described later with reference to FIG. 4. The fingerprint sensor 700 overlaps the opening op of the light shielding layer 600. The opening "op" of the light shielding layer 600 may expose at least a portion of the light path control layer 500. Accordingly, the fingerprint sensor 700 may directly contact the exposed light path control layer 500. In an exemplary embodiment of the present invention, when an element, for example, a protective layer is disposed between the light path control layer 500 and the light shielding layer 600, the fingerprint sensor 700 may directly contact the protective layer.

The fingerprint sensor 700 may be spaced apart from the light shielding layer 600 by a predetermined distance. For example, the fingerprint sensor 700 may be spaced apart from a side of the light shielding layer 600 by a first distance w1 and spaced apart from the other side of the light shielding layer 600 by a second distance w2. This spacing can prevent the light shielding layer 600 from being damaged due to misalignment that may occur during the process of forming the fingerprint sensor 700. Here, the first distance w1 and the second distance w2 are not necessarily the same.

Elements of the display panel 100, the light path control layer 500, and the fingerprint sensor 700 will now be described in more detail with reference to FIG. 3.

Figure 3:
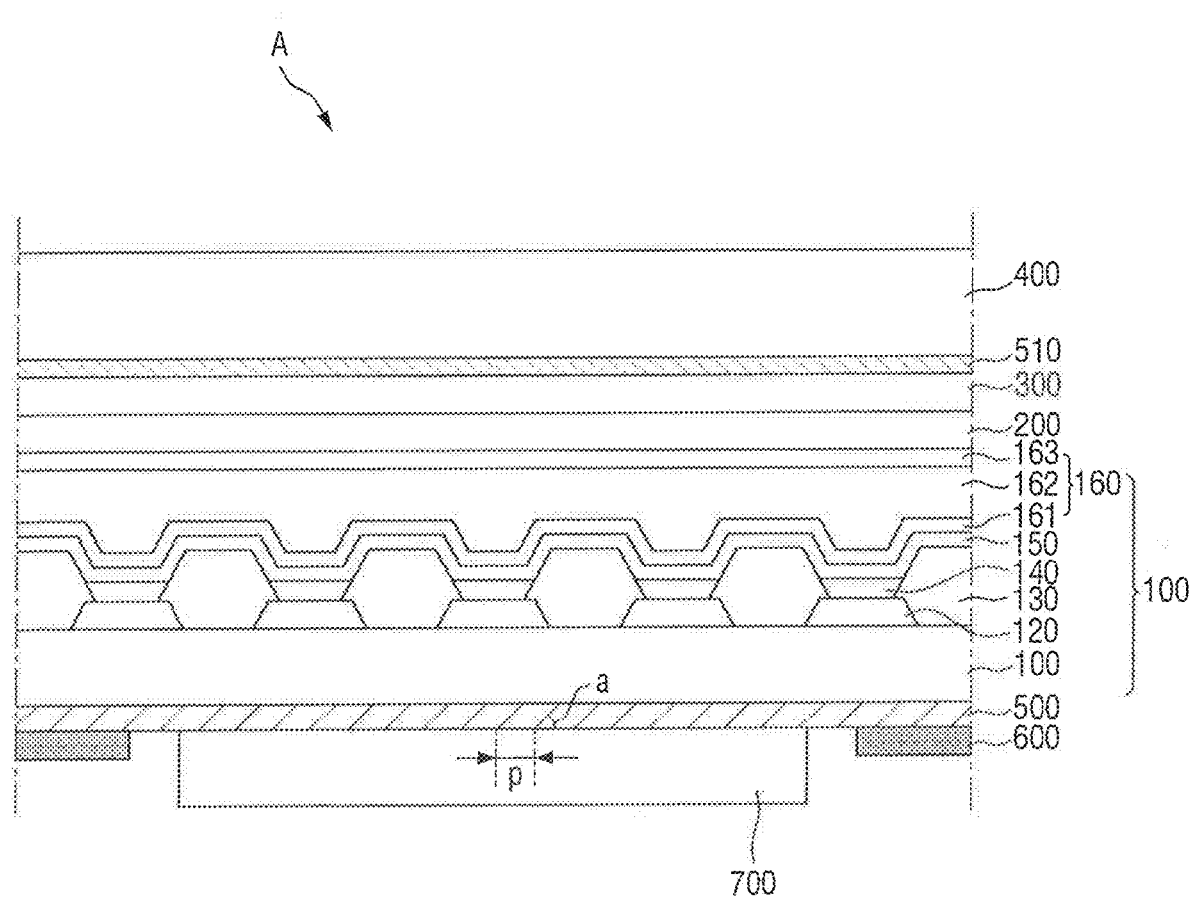
FIG. 3 illustrates an area 'A' of FIG. 2 in more detail.

FIG. 3 illustrates an area 'A' of FIG. 2 in more detail.

The display panel 100 may include a substrate 110, a plurality of pixel electrodes 120, a pixel defining layer 130, a plurality of organic light emitting layers 140, a common electrode 150, and an encapsulation layer 160.

The substrate 110 may be an insulating substrate. In an exemplary embodiment of the present invention, the substrate 110 may include a material such as glass, quartz, and/or polymer resin. Here, the polymer material may be polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination of these materials. In an exemplary embodiment of the present invention, the substrate 110 may be a flexible substrate such as a flexible substrate containing polyimide (PI).

The pixel electrodes 120 may be disposed on the substrate 110. A plurality of additional elements may be disposed between the substrate 110 and the pixel electrodes 120. In an exemplary embodiment of the present invention, the additional elements may include a buffer layer, a plurality of conductive wirings, an insulating layer, and a plurality of thin-film transistors. Here, the thin-film transistors may use amorphous silicon, polysilicon, low temperature polysilicon (LTPS), an oxide semiconductor, or an organic semiconductor as channel layers. The types of the respective channel layers of the thin-film transistors may be different from each other. In an exemplary embodiment of the present invention, both a thin-film transistor including an oxide semiconductor and a thin-film transistor including low temperature polysilicon (LTPS) may be formed in one pixel in consideration of the roles of the thin-film transistors or the process sequence.

The pixel electrodes 120 may be anodes. When the pixel electrodes 120 are anodes, they may be transparent electrodes or translucent electrodes or may include a reflective material such as aluminum, silver, chromium or an alloy of these materials. The transparent or translucent electrodes may include indium tin oxide (ITO), indium zinc oxide (IZO), zinc oxide (ZnO), indium oxide ($In_2O_3$), indium gallium oxide (IGO) and/or aluminum zinc oxide (AZO). The reflective material may include silver (Ag), magnesium (Mg), chromium (Cr), gold (Au), platinum (Pt), nickel (Ni), copper (Cu), tungsten (W), and/or aluminum (Al).

Each of the pixel electrodes 120 may be formed as a single film in an exemplary embodiment of the present invention. Alternatively, each of the pixel electrodes 120 may be formed as a multi-film structure in which two or more materials are stacked.

When formed as a multi-film structure, each of the pixel electrodes 120 may include a reflective film and a transparent or translucent electrode disposed on the reflective film. In an exemplary embodiment of the present invention, each of the pixel electrodes 120 may include a reflective film and a transparent or translucent electrode disposed under the reflective film. For example, each of the pixel electrodes 120 may have a three-layer structure of ITO/Ag/ITO.

The pixel defining layer 130 may be disposed on the pixel electrodes 120. The pixel defining layer 130 includes a plurality of openings that at least partially expose the pixel electrodes 120. The pixel defining layer 130 may include an organic material or an inorganic material. In an exemplary embodiment of the present invention, the pixel defining layer 130 may include a material such as photoresist, polyimide resin, acrylic resin, a silicon compound, or polyacrylic resin.

The organic light emitting layers 140 may be disposed on the pixel electrodes 120 and the pixel defining layer 130. For example, the organic light emitting layers 140 may be disposed on regions of the pixel electrodes 120 exposed through the openings of the pixel defining layer 130. The organic light emitting layers 140 may at least partially cover sidewalls of the pixel defining layer 130 in an exemplary embodiment of the present invention.

Figure 5:
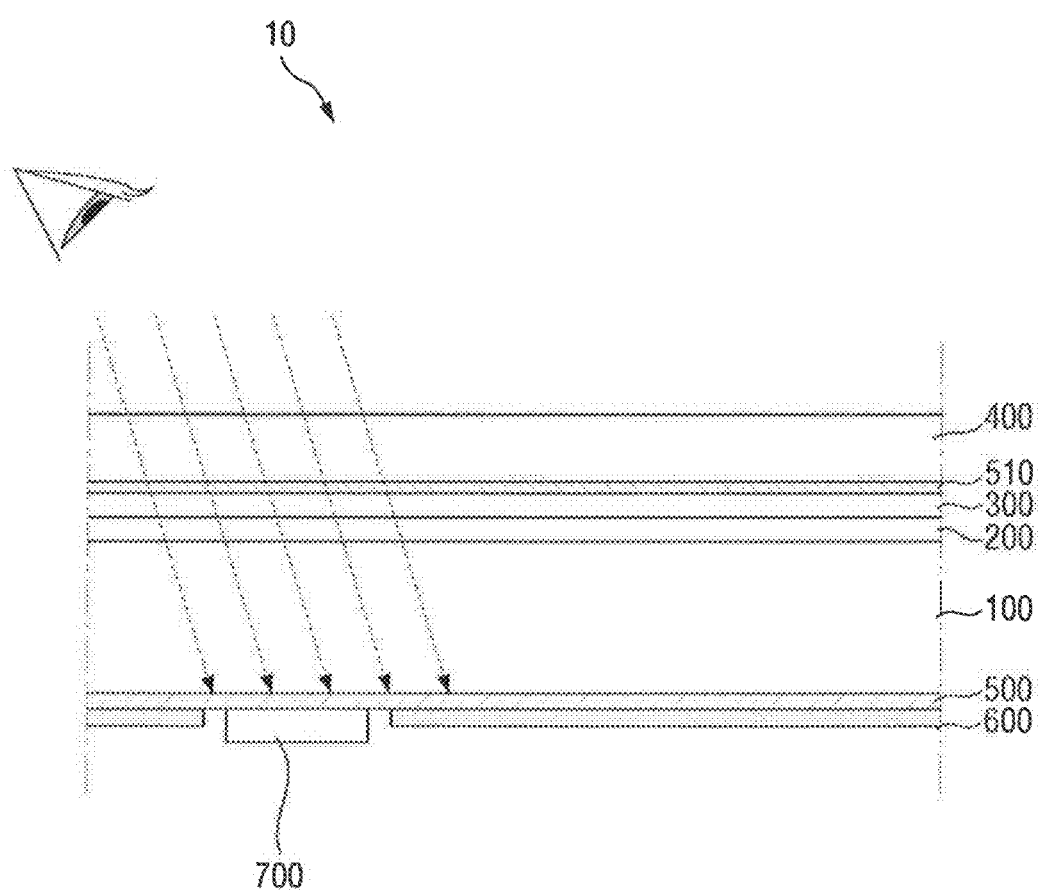
FIG. 5 is a view illustrating the relationship between a light path control layer and a fingerprint sensor in the display device according to an exemplary embodiment of the present disclosure.

In an exemplary embodiment of the present invention, the organic light emitting layers 140 may emit red, blue or green light. In an exemplary embodiment of the present invention, the organic light emitting layers 140 may emit white light or emit cyan, magenta, or yellow light. When the organic light emitting layers 140 emit white light, they may include a white light emitting material or may have a stack of a red light emitting layer, a green light emitting layer and a blue light emitting layer. As used herein, a front emission type light emitting layer is used in which light is emitted from the organic light emitting layers 140 in an upward direction as shown in FIG. 5. However, a bottom emission type or a double side emission type light emitting layer can also be employed.

The common electrode 150 may be disposed on the organic light emitting layers 140 and the pixel defining layer 130. The common electrode 150 may be entirely formed on the organic light emitting layers 140 and the pixel defining layer 130. The common electrode 150 may be a cathode. The common electrode 150 may include Li, Ca, LiF/Ca, LiF/Al, Al, Ag, and/or Mg. In addition, the common electrode 150 may be made of a material having a low work function. The common electrode 150 may be, in an exemplary embodiment of the present invention, a transparent or translucent electrode including indium tin oxide (ITO), indium zinc oxide (IZO), zinc oxide (ZnO), indium oxide ($In_2O_3$), indium gallium oxide (IGO), and/or aluminum zinc oxide (AZO).

The pixel electrodes 120, the organic light emitting layers 140 and the common electrode 150 described above may constitute an organic light emitting diode OLED. However, the organic light emitting diode OLED is not limited to the above example and may also be a multilayer structure further including a hole injection layer (HIL), a hole transport layer (HTL), an electron transport layer (ETL), and an electron injection layer (EIL).

The encapsulation layer 160 may be disposed opposite the substrate 110 and may cover the organic light emitting diode OLED. The encapsulation layer 160 may prevent moisture and air that is present in the environment from penetrating the organic light emitting diode OLED. In an exemplary embodiment of the present disclosure, the encapsulation layer 160 may include a first inorganic layer 161, an organic layer 162, and a second inorganic layer 163.

The first inorganic layer 161 may be disposed on the common electrode 150. The first inorganic layer 161 may include silicon oxide (SiOx), silicon nitride (SiNx), and/or silicon oxynitride (SiONx).

The organic layer 162 may be disposed on the first inorganic layer 161. The organic layer 162 may include epoxy, acrylate, and/or urethane acrylate. The organic layer 162 may planarize steps formed by the pixel defining layer 130.

The second inorganic layer 163 may be disposed on the organic layer 162. The second inorganic layer 163 may include silicon oxide (SiOx), silicon nitride (SiNx), and/or silicon oxynitride (SiONx).

In the figures, each of the first inorganic layer 161, the organic layer 162, and the second inorganic layer 163 is illustrated as a monolayer. However, the present invention is not limited to this case. For example, at least one of the first inorganic layer 161, the organic layer 162, and the second inorganic layer 163 may be formed in a multilayer structure.

In an exemplary embodiment of the present invention, the encapsulation layer 160 may include a hexamethyldisiloxane (HMDSO) layer. For example, the encapsulation layer 160 may include a first inorganic layer 161, a second inorganic layer 163, and an HMDSO layer disposed between the first inorganic layer 161 and the second inorganic layer 163. For example, the above-described organic layer 162 can be replaced with the HMDSO layer.

In an exemplary embodiment of the present invention, the HMDSO layer may be formed after the formation of the first inorganic layer 161 in the same chamber in which the first inorganic layer 161 is formed. Thus, the process of forming the encapsulation layer 160 can be simplified. In addition, the encapsulation layer 160 can be made flexible by including the HMDSO layer that can absorb stress.

Alternatively, the encapsulation layer 160 may be a transparent insulating substrate. Here, the transparent insulating substrate may be a glass substrate, a quartz substrate, a transparent resin substrate, or the like. When the encapsulation layer 160 is a transparent insulating substrate, it may be bonded to the substrate 110 by a sealant.

The light path control layer 500 may include a plurality of viewing angle control patterns 501 and a plurality of light transmitting regions 502 defined as regions between the viewing angle control patients 501.

The viewing angle control patterns 501 may selectively block the path of light provided to the display panel 100 from the outside. The viewing angle control patterns 501 may have a predetermined pitch p and a predetermined angle a. The pitch p is defined as a distance between the viewing angle control patterns 501. The angle a is defined as the degree to which the viewing angle control patterns 501 are inclined with respect to a lower surface of the light path control layer 500. The pitch p and the angle a may be set according to the required viewing angle condition of the display device 10. For example, the pitch p and the angle a may be set to values that can prevent the fingerprint sensor 700 from being seen by a user at a certain angle. In an exemplary embodiment of the present invention, the pitch p may be set in the range of lens of nm to tens of μm. In addition, the angle a may be set in the range of about 30 degrees to about 90 degrees. In an exemplary embodiment of the present invention, the respective pitches p and angles a of the viewing angle control patterns 501 may be equal to each other.

The material of the viewing angle control patterns 501 may be formed of any material that can selectively block the path of light provided to the display panel 100. In an exemplary embodiment of the present invention, the viewing angle control patterns 501 may be made of a dark pigment such as a black pigment, a black dye, a gray pigment or a gray dye or may be made of a light shielding material such as a photoresist.

For example, the light path control layer 500 including the viewing angle control patterns 501 may block light incident from the outside from reaching the display panel 100 at an angle equal to or greater than a specific angle. In addition, the light path control layer 500 may transmit light incident from the outside to the display panel 100 at an angle smaller than the specific angle through the light transmitting legions 502 formed between the viewing angle control patterns 501.

The fingerprint sensor 700 may overlap at least some of the organic light emitting layers 140 in a direction perpendicular to the substrate 110. Here, the organic light emitting layers 140 overlapping the fingerprint sensor 700 are a plurality of organic light emitting layers 140 disposed in the fingerprint recognition area 13 (see FIG. 1), and any number of organic light emitting layers 140 may be used. In addition, the fingerprint sensor 700 may be of any size as long as the fingerprint sensor 700 can recognize a user's fingerprint. When light emitted from the organic light emitting layers 143 is reflected from the finger of the user, the fingerprint sensor 700 can recognize the user's fingerprint through the reflected light.

A fingerprint recognition method will now be described in detail with reference to FIG. 4.

Figure 4:
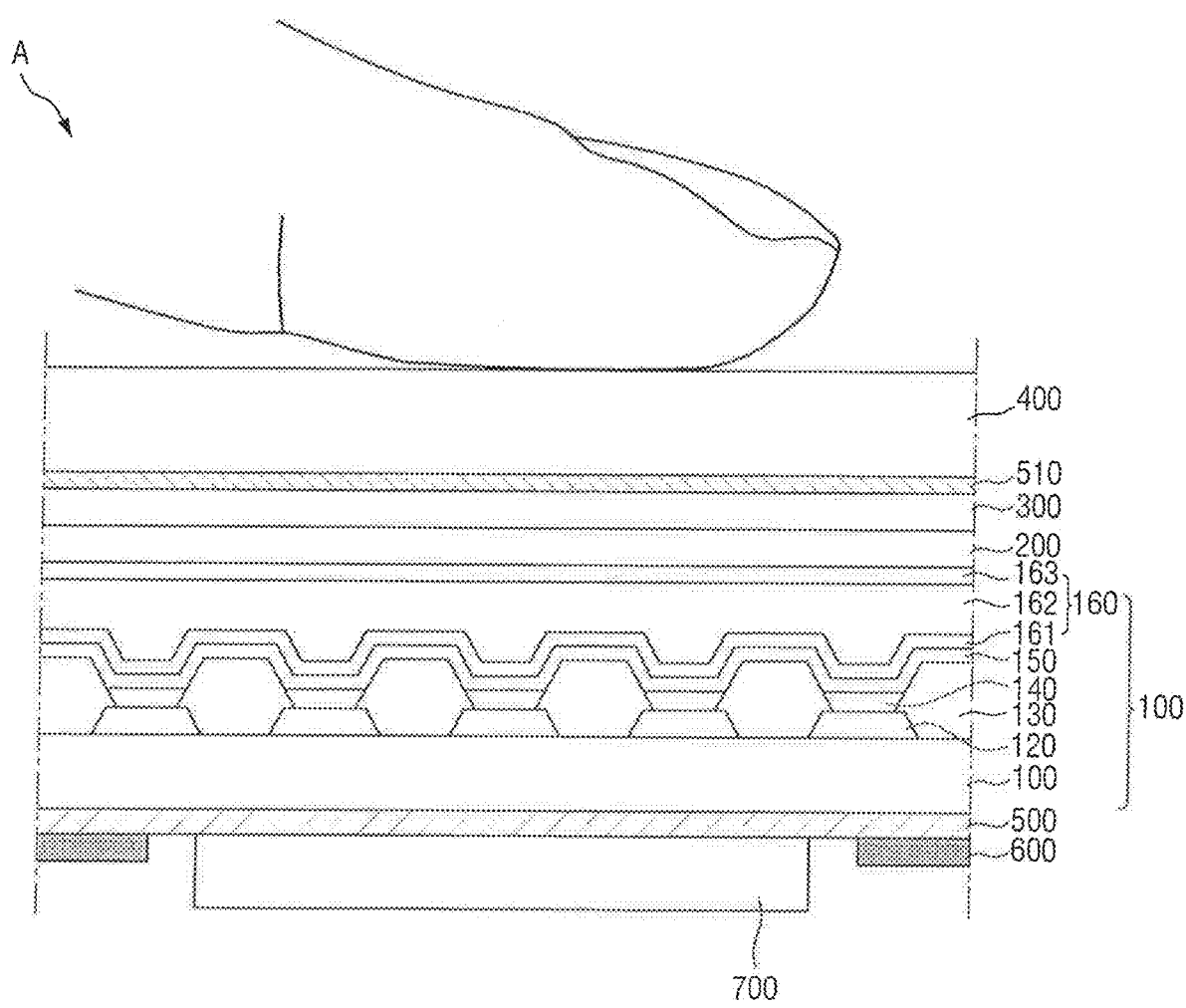
FIG. 4 is a view illustrating a fingerprint recognition method of the display device according to an exemplary embodiment of the present disclosure.

FIG. 4 is a view illustrating a fingerprint recognition method of the display device 10 according to an exemplary embodiment of the present invention.

Referring to FIG. 4, light emitted from the organic light emitting layers 140 disposed in the fingerprint recognition area 13 (see FIG. 1) may be directed to a user's finger that may make contact with or be brought close to the window panel 400. The fingerprint sensor 700 may receive light reflected off of the user's finger among the light emitted from the organic light emitting layers 140. The fingerprint sensor 700 may recognize the user's fingerprint based on the received light. In an exemplary embodiment of the present disclosure, the fingerprint sensor 700 may create image information required for fingerprint recognition using the received light and store the created image information in a memory of the fingerprint sensor 700 or in a memory of the display panel 100.

The relationship between the fingerprint sensor 700 and the light path control layer 500 will now be described in more detail with reference to FIG. 5.

FIG. 5 is a view illustrating the relationship between the light path control layer 500 and the fingerprint sensor 700 in the display device 10 according to an exemplary embodiment of the present invention.

Referring to FIG. 5, the light path control layer 500 may block outside light from reaching the display panel 100 at an angle equal to or greater than a specific angle. Therefore, the light path control layer 500 can prevent the fingerprint sensor 700 and the fingerprint recognition area 13 (see FIG. 1) from being seen by a user at a certain angle. For example, in a case where the fingerprint sensor 700 and the light shielding layer 600 are spaced apart from each other, the light path control layer 500 can prevent a space between the fingerprint sensor 700 and the light shielding layer 600 from being recognized due to external light incident on the space.

In addition, since the light path control layer 500 includes the light transmitting regions 502 (see FIG. 3), it is possible to secure paths through which light reflected from the finger of the user among light emitted from the organic light emitting layers 140 can be received.

Therefore, in the display device 10 according to exemplary embodiments of the present invention, since the light path control layer 500 is formed overlapping the fingerprint sensor 700 disposed in the opening op of the light shielding layer 600, the fingerprint sensor 700 can be prevented from being recognized at a certain angle.

Figure 6A:
FIGS. 6A through 8B are views illustrating the degree to which the fingerprint sensor in the display device is recognized at each angle in accordance with exemplary embodiments of the present disclosure.
Figure 6B:
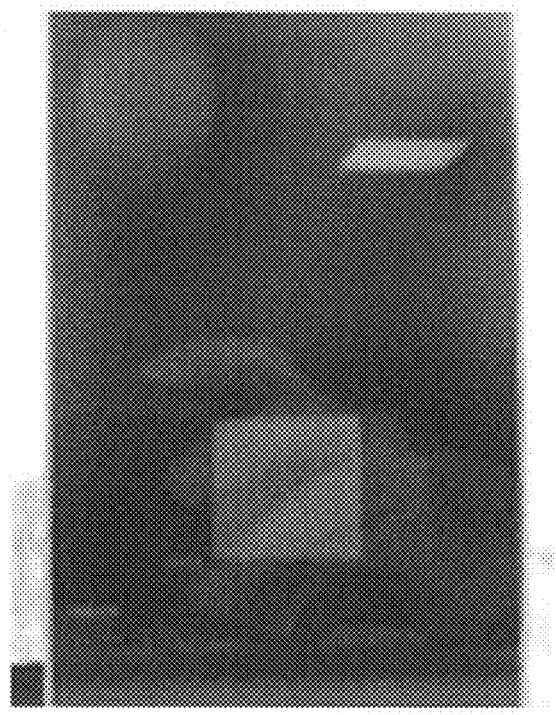
Figure 7A:
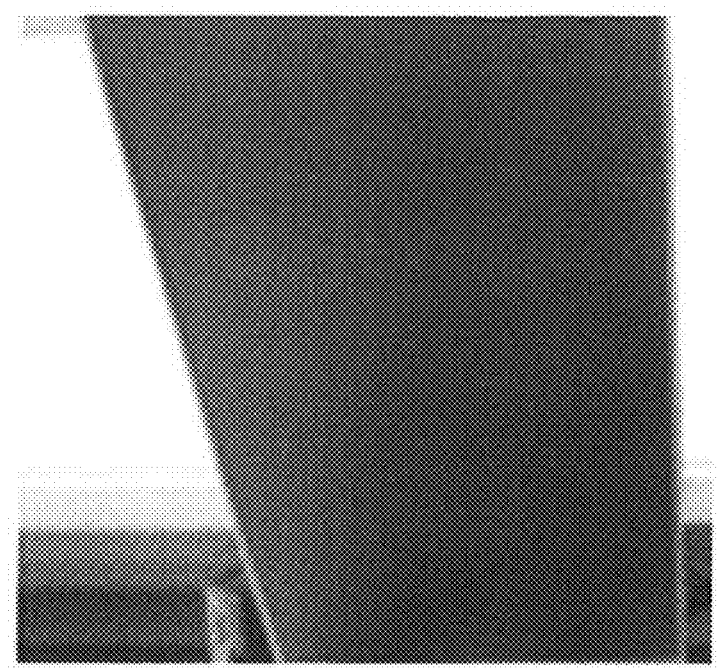
Figure 7B:
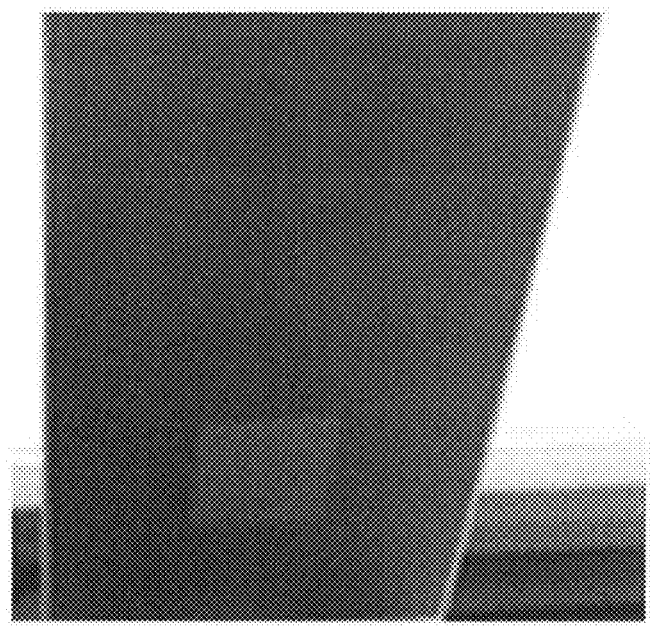
Figure 8A:
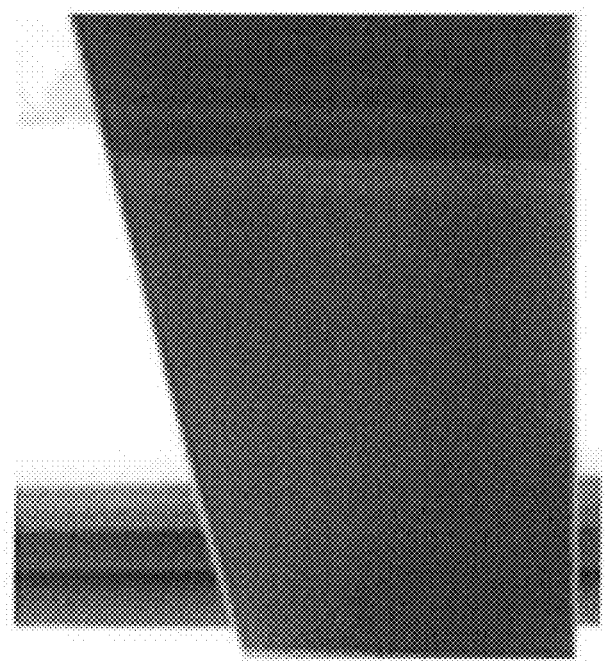
Figure 8B:
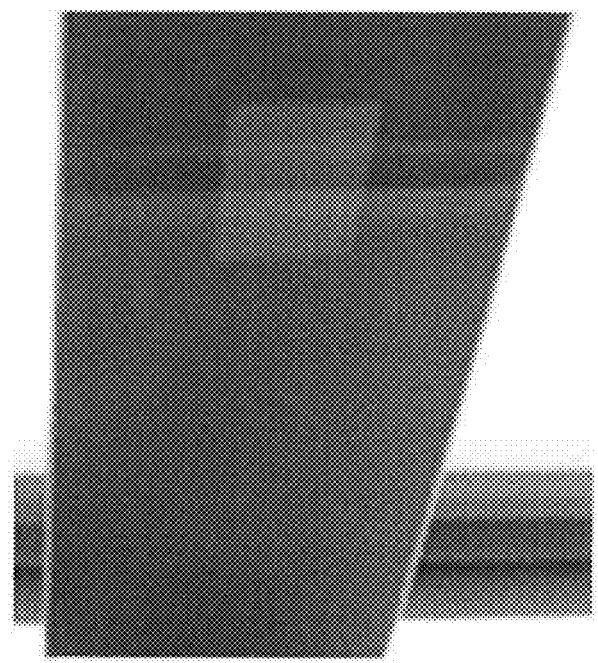

FIGS. 6A through 8B show the degree to which the fingerprint sensor 700 in the display device 10 is recognized at each angle. Here, FIGS. 6A and 6B show a case where a user views a display device from the front, and FIGS. 7A and 7B show a case where the user views the display device al an angle of +45 degrees. FIGS. 8A and 8B show a case where the user views the display device at an angle of −45 degrees.

Referring to FIGS. 6A through 8B, a fingerprint recognition area is recognized to a lesser extent in the display device 10 (FIGS. 6A, 7A and FIG. 8A) than in a display device according to a comparative example (FIGS. 6B, 7B and 8B). Here, the display device according to the comparative example does not include the light path control layer 500.

For example, in the display device 10 according to an exemplary embodiment of the present invention, the visibility of the fingerprint recognition area 13 (see FIG. 1) overlapping the opening "op" (see FIG. 2) of the light shielding layer 600 for fingerprint recognition can be reduced.

Display devices according to exemplary embodiments of the present invention will now be described with reference to FIGS. 9 and 10.

Figure 9:
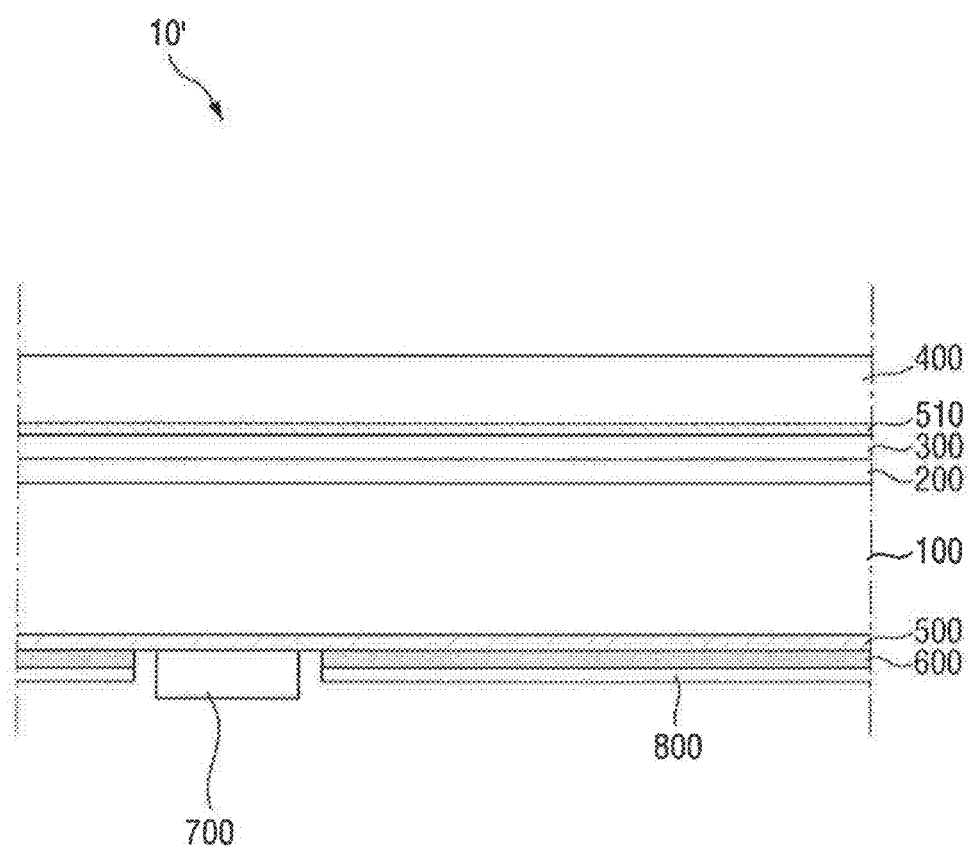
FIG. 9 is a cross-sectional view illustrating a display device according to an exemplary embodiment of the present disclosure.

FIG. 9 is a cross-sectional view illustrating a display device 10' according to an exemplary embodiment of the present invention. FIG. 10 is a cross-sectional view illustrating a display device 10" according to an exemplary embodiment of the present invention. In describing what is shown in these figures, to the extent that details are omitted, it may be assumed that the omitted details are at least similar to those of corresponding elements referred to with respect to FIGS. 1 through 8B.

Referring to FIG. 9, the display device 10' according to exemplary embodiments of the present invention may further include a protective layer 800.

The protective layer 800 may be disposed under a light shielding layer 600. In addition, the protective layer 800 may include an opening overlapping an opening "op" of the light shielding layer 600 in which a fingerprint sensor 700 is disposed.

According to an exemplary embodiment of the present invention, the protective layer 800 may include a buffer that can absorb external shock and a heat dissipater that can dissipate heat generated in the display device 10'. Although the protective layer 800 is illustrated as one layer in FIG. 9, it may be formed as a stack of a plurality layers when the protective layer 800 includes both the buffer and the heat dissipater.

The buffer may include a material capable of absorbing shock. According to an exemplary embodiment of the present invention, the buffer may include an elastic polymer resin such as polyethylene, polycarbonate, polyurethane, or polypropylene. Alternatively, the buffer may be a sponge formed by foaming a liquid rubber, a urethane-based material, or an acrylic-based material.

In addition, the heal dissipater may include copper (Cu). Besides copper (Cu), the heat dissipater may include a metal having excellent thermal conductivity such as silver (Ag), a copper alloy or aluminum (Al) or a carbon-based material such as graphite or graphene. In this context, an excellent thermal conductivity is understood to mean a thermal conductivity at least similar to that of copper.

Although not illustrated in the drawing, the display device 10' may further include a digitizer. In an exemplary embodiment of the present invention, the digitizer may recognize the approach and/or touch of a stylus pen or the like through electromagnetic induction. The digitizer may include an opening in which the fingerprint sensor 700 is disposed, and the opening may correspond to the opening "op" of the light shielding layer 600.

Figure 10:
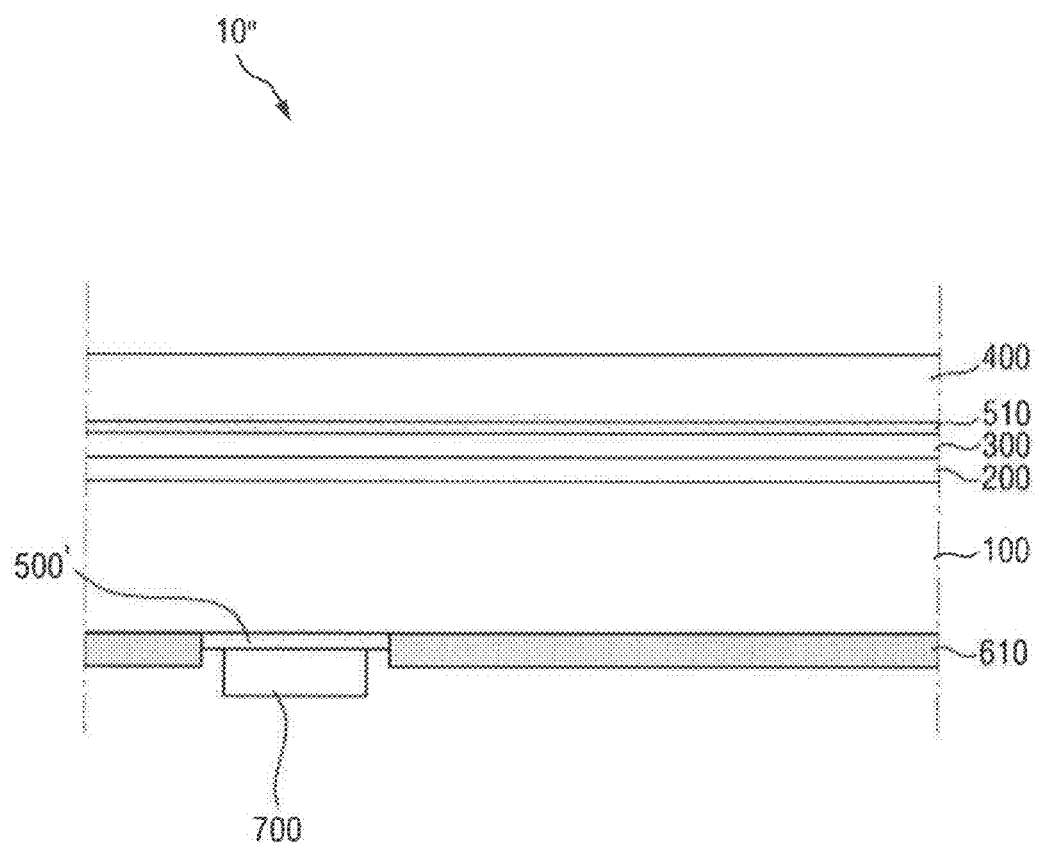
FIG. 10 is a cross-sectional view illustrating a display device according to an exemplary embodiment of the present disclosure.

Referring to FIG. 10, the display device 10" may include a light path control pattern 500'. For example, the display device 10" illustrated in FIG. 10 is different at least in that it includes the light path control pattern 500' instead of the light path control layer 500 illustrated in FIG. 2.

For example, the light path control patters 500' may be formed only in an opening of a light shielding layer 610. Therefore, the cost of forming the light path control pattern 500' can be reduced.

According to exemplary embodiments of the present disclosure, it is possible to prevent a user from recognizing a fingerprint recognition area at a certain angle while securing a light path for fingerprint recognition.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device comprising:
    a light shielding layer comprising an opening;
    a fingerprint sensor disposed within or overlapping the opening of the light shielding layer;
    a light path control layer disposed on the fingerprint sensor and the light shielding layer, the light path control layer covering the opening of the light shielding layer;
    a display panel disposed on the light path control layer and comprising a plurality of display elements; and
    a window panel disposed on the display panel,
    wherein the light path control layer comprises a plurality of viewing angle control patterns having a first angle with respect to the display panel and a plurality of light transmitting regions disposed between each of the plurality of viewing angle control patterns,
    wherein each of the plurality of viewing angle control patterns comprises a light shielding material, and
    wherein the light shielding material includes at least one of a black pigment, a black dye, a gray pigment and a gray dye.

2. The display device of claim 1, wherein the first angle is within a range of 30 degrees to 90 degrees.

3. The display device of claim 1, wherein the viewing angle control patterns of the plurality of viewing angle control patterns are spaced apart from each other with a first pitch, wherein the first pitch is within a range of 0.04 μm to 0.2 μm.

4. The display device of claim 1, wherein the light path control layer completely covers the opening of the light shielding layer.

5. The display device of claim 1, wherein the light path control layer completely covers an area between the light shielding layer and the fingerprint sensor.

6. The display device of claim 1, wherein the fingerprint sensor receives light that is emitted from the plurality of display elements of the display panel and is then reflected from a user's finger that is in contact with or close to the window panel.

7. The display device of claim 6, wherein the plurality of display elements of the display panel includes a plurality of organic light emitting layers.

8. The display device of claim 1, further comprising a protective layer which has an opening overlapping the opening of the light shielding layer, wherein the light shielding layer is disposed on the protective layer and the protective layer comprises a heat dissipater and/or a buffer.

9. A display device comprising:
a display panel;
a window panel disposed on the display panel, the display panel including a fingerprint recognition area;
a light shielding layer disposed under the display panel, the light shielding layer including an opening overlapping the fingerprint recognition area; and
a light path control layer disposed between the light shielding layer and the display panel and overlapping the opening of the light shielding layer,
wherein the light path control layer comprises a plurality of viewing angle control patterns having a first angle with respect to the display panel and a plurality of light transmitting regions disposed between each of the plurality of viewing angle control patterns,
wherein each of the plurality of viewing angle control patterns comprises a light shielding material, and
wherein the light shielding material includes at least one of a black pigment, a black dye, a ray pigment and a gray dye.

10. The display device of claim 9, wherein the light path control layer completely covers the opening of the light shielding layer.

11. The display device of claim 9, further comprising a fingerprint sensor which is disposed under the light path control layer, wherein the fingerprint sensor is disposed in or overlaps the opening of the light shielding layer.

12. The display device of claim 11, wherein the light path control layer completely covers an area between the fingerprint sensor and the light shielding layer.

13. The display device of claim 9, wherein the viewing angle control patterns of the plurality of viewing angle control patterns are spaced apart from each other with a first pitch.

14. The display device of claim 13, wherein the first angle is within a range of 30 degrees to 90 degrees.

15. The display device of claim 13, wherein the first pitch is within a range of 0.04 μm to 0.2 μm.

16. The display device of claim 9, wherein a width of the fingerprint recognition area is equal to a width of the opening of the light shielding layer.

* * * * *